US012769208B2

(12) United States Patent
Akiyama et al.

(10) Patent No.: US 12,769,208 B2
(45) Date of Patent: Oct. 20, 2026

(54) PHOTOSENSITIVE STRUCTURE FOR FLEXOGRAPHIC PRINTING PLATE AND METHOD FOR PRODUCING FLEXOGRAPHIC PRINTING PLATE

(71) Applicant: ASAHI KASEI KABUSHIKI KAISHA, Tokyo (JP)

(72) Inventors: Hiroki Akiyama, Tokyo (JP); Shinji Miyamoto, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 616 days.

(21) Appl. No.: 18/023,039

(22) PCT Filed: Sep. 15, 2021

(86) PCT No.: PCT/JP2021/033981
§ 371 (c)(1),
(2) Date: Feb. 24, 2023

(87) PCT Pub. No.: WO2022/065166
PCT Pub. Date: Mar. 31, 2022

(65) Prior Publication Data

US 2023/0305402 A1 Sep. 28, 2023

(30) Foreign Application Priority Data

Sep. 28, 2020 (JP) ................................ 2020-161734

(51) Int. Cl.
*G03F 7/095* (2006.01)
*B41C 1/10* (2006.01)
*G03F 7/039* (2006.01)

(52) U.S. Cl.
CPC ............ *G03F 7/095* (2013.01); *B41C 1/1033* (2013.01); *G03F 7/039* (2013.01)

(58) Field of Classification Search
None
See application file for complete search history.

(56) References Cited

U.S. PATENT DOCUMENTS

| | | | | |
|---|---|---|---|---|
| 6,096,476 | A | 8/2000 | Yanagida et al. | |
| 6,294,313 | B1 * | 9/2001 | Kobayashi ............ | G03F 7/0005 430/302 |
| 2003/0211419 | A1 | 11/2003 | Fan | |
| 2005/0271950 | A1 | 12/2005 | Nishikawa et al. | |
| 2006/0127805 | A1 * | 6/2006 | Ali ............................ | G03F 1/68 430/270.1 |
| 2011/0236705 | A1 * | 9/2011 | Melamed ................. | B05D 5/00 427/385.5 |
| 2011/0275016 | A1 | 11/2011 | Iso | |
| 2013/0029103 | A1 | 1/2013 | Andry-Coltrain et al. | |
| 2013/0260121 | A1 * | 10/2013 | Inoue ...................... | G03F 7/202 428/217 |
| 2018/0275515 | A1 * | 9/2018 | Saito ........................ | G03F 7/09 |
| 2020/0150533 | A1 | 5/2020 | Tabata et al. | |
| 2021/0229480 | A1 * | 7/2021 | Nakagawa ................ | G03F 7/11 |
| 2022/0082940 | A1 * | 3/2022 | Toyooka ................. | G03F 7/095 |

FOREIGN PATENT DOCUMENTS

| | | | | |
|---|---|---|---|---|
| CN | 1177947 | | 4/1998 | |
| CN | 102257434 | | 11/2011 | |
| CN | 110945428 | | 3/2020 | |
| JP | 2916408 | | 4/1999 | |
| JP | 11-153865 | | 6/1999 | |
| JP | 2005-221842 | | 8/2005 | |
| JP | 2006-163284 | | 6/2006 | |
| JP | 4080068 | | 4/2008 | |
| JP | 2009-119810 | | 6/2009 | |
| JP | 2010-237583 | | 10/2010 | |
| JP | 2010237583 | A * | 10/2010 | |
| JP | 2011-102021 | | 5/2011 | |
| JP | 2012-137515 | | 7/2012 | |
| JP | 2015-121652 | | 7/2015 | |
| JP | 2016-188900 | | 11/2016 | |
| JP | 2019-95470 | | 6/2019 | |
| WO | WO-2018056211 | A1 * | 3/2018 | ............. G03F 7/033 |
| WO | 2020/175422 | | 9/2020 | |
| WO | WO-2020175422 | A1 * | 9/2020 | ................ G03F 7/11 |

OTHER PUBLICATIONS

Mitsubishi Chemical Corp.—Carbon Black Product Lines (Year: 2006).*

(Continued)

*Primary Examiner* — Sally A Merkling
*Assistant Examiner* — Andrew Preston Traywick
(74) *Attorney, Agent, or Firm* — GREENBLUM & BERNSTEIN, P.L.C.

(57) ABSTRACT

A photosensitive resin structure for a flexographic printing plate, containing (a): a support;

(b): a photosensitive resin composition layer which is located on the support (a) and which contains a thermoplastic elastomer having a copolymer site of a monovinyl-substituted aromatic hydrocarbon and a conjugated diene; and (c): an infrared ray ablation layer which is laminated on the photosensitive resin composition layer (b) and which comprises a resin and carbon black, is ablatable with an infrared laser, and is a layer shielding a light beam other than infrared ray, wherein the resin in the infrared ray ablation layer (c) contains a copolymer of a monovinyl-substituted aromatic hydrocarbon and a conjugated diene, or a hydrogenated copolymer of a monovinyl-substituted aromatic hydrocarbon and a conjugated diene, and a primary particle diameter of the carbon black contained in the infrared ray ablation layer (c) is 13 nm or larger and 25 nm or smaller.

14 Claims, No Drawings

(56) References Cited

OTHER PUBLICATIONS

Translated Description of Nagano (Year: 2010).*
"Introducing Mitsubishi Carbon Black Products: Table of Physical and Chemical Properties", Jul. 18, 2007, XP093129792, Retrieved from the Internet: URL: https://web.archive.org/web/20070718145750/http://www.carbonblack.jp:80/en/product/list2_01.html [retrieved on Feb. 9, 2024].
Supplementary Search Report issued in EP Application No. 21872296.5, dated Feb. 29, 2024.
International Search Report issued in International Patent Application No. PCT/JP2021/033981, dated Dec. 7, 2021.
International Preliminary Report on Patentability issued in International Patent Application No. PCT/JP2021/033981, dated Dec. 7, 2021, along with an English translation thereof.

* cited by examiner

PHOTOSENSITIVE STRUCTURE FOR FLEXOGRAPHIC PRINTING PLATE AND METHOD FOR PRODUCING FLEXOGRAPHIC PRINTING PLATE

TECHNICAL FIELD

The present invention relates to a photosensitive structure for a flexographic printing plate and a method for producing a flexographic printing plate.

BACKGROUND ART

In recent years, further enhancement of definition of printed images has been required.

Meanwhile, methods of directly drawing digital images with laser without the use of negative films by a CTP (computer to plate) technique have heretofore been widely used in the production process of flexographic printing plates.

In the CTP technique, a plate obtained by laminating a photosensitive resin composition layer, an infrared ray ablation layer ablatable with an infrared ray, and a cover film in order on a substrate such as a PET (polyethylene terephthalate) resin is generally used as an original plate for flexographic printing plate production.

The infrared ray ablation layer ablatable with an infrared ray generally contains an infrared ray absorber which is a material opaque to radiation other than infrared ray, and a binder.

Techniques of disposing microcells on the surface of printing plates have heretofore been known as techniques for achieving further enhancement of definition of printed images or improvement in ink transfer properties at the time of printing. Enhancement of resolution is also achieved in laser drawing apparatuses for use in the production process of flexographic printing plates, and the resolution has been enhanced from conventional laser resolution of 2540 DPI to 4000 DPI and further to 5080 DPI.

For these reasons, the formation of smaller microcells further requires microfabrication by laser drawing for flexographic printing plates. Techniques for obtaining infrared ray ablation layers excellent in infrared laser drawing properties have been required therefor in the production process of flexographic printing plates.

For example, Patent Document 1 proposes a technique using polyamide as a binder of an infrared ray ablation layer. Patent Document 2 proposes a technique using partially saponified polyvinyl acetate having a degree of saponification of 60 to 100% by mol and a cationic polymer as a binder of an infrared ray ablation layer.

Patent Document 3 proposes a technique using a copolymer consisting of a monovinyl-substituted aromatic hydrocarbon and a conjugated diene or a hydrogenated copolymer consisting of a monovinyl-substituted aromatic hydrocarbon and a conjugated diene as a binder of an infrared ray ablation layer.

CITATION LIST

Patent Document

Patent Document 1: Japanese Patent No. 2916408
Patent Document 2: Japanese Patent Laid-Open No. 2016-188900
Patent Document 3: Japanese Patent No. 4080068

SUMMARY OF INVENTION

Technical Problem

However, the polyamide binder or the binder containing partially saponified polyvinyl acetate and a cationic polymer, disclosed in Patent Documents 1 and 2 has poor adhesion to a thermoplastic elastomer containing a polymer of a styrene derivative and a conjugated diene monomer, which is generally used in photosensitive resin composition layers, and therefore has the following problem: the infrared ray ablation layer easily peels off the photosensitive resin composition layer in the production process for printing plates.

Use of the copolymer consisting of a monovinyl-substituted aromatic hydrocarbon and a conjugated diene or the hydrogenated copolymer consisting of a monovinyl-substituted aromatic hydrocarbon and a conjugated diene as a binder of an infrared ray ablation layer, as disclosed in Patent Document 3, has the following problem: sufficient characteristics cannot be obtained as to infrared laser drawing properties.

Thus, in view of the above-described problems of the conventional techniques, an object of the present invention is to provide a photosensitive resin structure for a flexographic printing plate, the photosensitive resin structure having no negative effect on the production process of flexographic printing plates and having an infrared ray ablation layer excellent in laser drawing properties.

Solution to Problem

The inventors of the present application have conducted diligent studies in order to solve the problems to find that the above-described problems can be solved by a photosensitive resin structure for a flexographic printing plate, having a support, a photosensitive resin composition layer, and an infrared ray ablation layer having a specific configuration, and thereby completed the present invention.

That is, the present invention is as follows.

[1]

A photosensitive resin structure for a flexographic printing plate, containing (a): a support;

(b): a photosensitive resin composition layer which is located on the support (a) and which contains a thermoplastic elastomer having a copolymer site of a monovinyl-substituted aromatic hydrocarbon and a conjugated diene; and (c): an infrared ray ablation layer which is laminated on the photosensitive resin composition layer (b) and which contains a resin and carbon black, is ablatable with an infrared laser, and is a layer shielding a light beam other than infrared ray, wherein the resin in the infrared ray ablation layer (c) contains a copolymer of a monovinyl-substituted aromatic hydrocarbon and a conjugated diene, or a hydrogenated copolymer of a monovinyl-substituted aromatic hydrocarbon and a conjugated diene, and a primary particle diameter of the carbon black contained in the infrared ray ablation layer (c) is 13 nm or larger and 25 nm or smaller.

[2]

The photosensitive resin structure for the flexographic printing plate according to [1], wherein 90% by mass or more of the resin in the infrared ray ablation layer is a copolymer of a monovinyl-substituted aromatic hydrocarbon and a conjugated diene, or a hydrogenated copolymer of a monovinyl-substituted aromatic hydrocarbon and a conjugated diene.

[3]

The photosensitive resin structure for the flexographic printing plate according to [1] or [2], wherein the primary particle diameter of the carbon black is 15 nm or larger and 20 nm or smaller.

[4]

The photosensitive resin structure for the flexographic printing plate according to any one of [1] to [3], wherein a DBP absorption number of the carbon black is 40 $cm^3/100$ g or more and 80 $cm^3/100$ g or less.

[5]

The photosensitive resin structure for the flexographic printing plate according to any one of [1] to [4], wherein pH of the carbon black is 6.0 or higher and 8.5 or lower.

[6]

The photosensitive resin structure for the flexographic printing plate according to any one of [1] to [5], wherein R which is calculated according to the following expression (1) from a Hansen solubility parameter value (HSP value) of the resin and a Hansen solubility parameter value (HSP value) of the carbon black in the infrared ray ablation layer is 11.0 or more and 13.0 or less:

$$R=(4\alpha^2+\beta^2+\gamma^2)^{0.5} \qquad \text{Expression (1)}$$

$\alpha$=an absolute value of difference between $\delta d$ of the resin and $\delta d$ of the carbon black $\beta$=an absolute value of difference between $\delta p$ of the resin and $\delta p$ of the carbon black $\gamma$=an absolute value of difference between $\delta h$ of the resin and $\delta h$ of the carbon black $\delta d$: energy from dispersion force between molecules $\delta p$: energy from dipolar interaction between molecules $\delta h$: energy from a hydrogen bond between molecules.

[7]

The photosensitive resin structure for the flexographic printing plate according to any one of [1] to [6], wherein the resin in the infrared ray ablation layer (c)

contains a styrene-conjugated diene copolymer having a styrene content of 40% by mass or more and 80% by mass or less.

[8]

The photosensitive resin structure for the flexographic printing plate according to any one of [1] to [6], wherein the resin in the infrared ray ablation layer (c) contains a hydrogenated styrene-conjugated diene copolymer having a styrene content of 30% by mass or more and 70% by mass or less.

[9]

A method for producing a flexographic printing plate, using the photosensitive structure for the flexographic printing plate according to any one of [1] to [8], and containing:

a first step of performing ultraviolet ray irradiation from a side of the support (a);

a second step of drawing and processing a pattern on the infrared ray ablation layer (c) by infrared ray irradiation;

a third step of irradiating the photosensitive resin composition layer (b) with an ultraviolet ray for pattern exposure; and a fourth step of removing the infrared ray ablation layer (c) and an unexposed portion of the photosensitive resin composition layer (b).

Advantageous Effect of Invention

The present invention can provide a photosensitive resin structure for a flexographic printing plate, the photosensitive resin structure having no negative effect on the production process of printing plates and having an infrared ray ablation layer excellent in laser drawing properties.

DESCRIPTION OF EMBODIMENTS

Hereinafter, an embodiment for carrying out the present invention (hereinafter, referred to as "present embodiment") will be described in detail. The present embodiment given below is an illustration for describing the present invention and does not intend to limit the present invention to the description below. The present invention can be carried out by being modified variously within the range of the scope thereof.

[Photosensitive Resin Structure for Flexographic Printing Plate]

A photosensitive resin structure for a flexographic printing plate according to the present embodiment contains:

(a): a support;

(b): a photosensitive resin composition layer which is located on the support (a) and which contains a thermoplastic elastomer having a copolymer site of a monovinyl-substituted aromatic hydrocarbon and a conjugated diene; and (c): an infrared ray ablation layer which is laminated on the photosensitive resin composition layer (b) and which contains a resin and carbon black, is ablatable with an infrared laser, and is a layer shielding a light beam other than infrared ray, wherein the resin in the infrared ray ablation layer (c) contains a copolymer of a monovinyl-substituted aromatic hydrocarbon and a conjugated diene, or a hydrogenated copolymer of a monovinyl-substituted aromatic hydrocarbon and a conjugated diene, and a primary particle diameter of the carbon black contained in the infrared ray ablation layer (c) is 13 nm or larger and 25 nm or smaller.

(Support (a))

Examples of the support (a) for use in the photosensitive resin structure for the flexographic printing plate according to the present embodiment include, but not limited to, a polyester film.

Examples of the polyester for use in the support include polyethylene terephthalate, polybutylene terephthalate, and polyethylene naphthalate.

The thickness of the support (a) is not particularly limited and is preferably 50 to 300 μm from the viewpoint of strength and handling properties.

An adhesive layer may be provided on the support (a) in order to enhance the adhesive force between the support (a) and the photosensitive resin composition layer (b) which will be described later. Examples of the adhesive layer include the adhesive layer described in International Publication No. WO 2004/104701.

(Photosensitive Resin Composition Layer (b))

The photosensitive resin structure for the flexographic printing plate according to the present embodiment has a photosensitive resin composition layer (b) on the support (a).

The photosensitive resin composition layer (b) may be laminated directly on the support (a), or a predetermined adhesive layer or the like may be formed between them.

The photosensitive resin composition layer (b) contains a thermoplastic elastomer (b-1) which will be described later, and preferably contains an ethylenically unsaturated compound (b-2), a photopolymerization initiator (b-3), and a liquid diene, and, if necessary, may further contain an auxiliary additive component.

<Thermoplastic Elastomer (b-1)>

The photosensitive resin composition layer (b) contains a thermoplastic elastomer (b-1) having a copolymer site of a monovinyl-substituted aromatic hydrocarbon and a conjugated diene.

"Having a copolymer site" means that the thermoplastic elastomer (b-1) may have a site formed from another monomer other than the monovinyl-substituted aromatic hydrocarbon and the conjugated diene.

By containing the thermoplastic elastomer (b-1) having a copolymer site of a monovinyl-substituted aromatic hydrocarbon and a conjugated diene, a photosensitive resin composition layer (b) excellent in durability can be obtained.

The thermoplastic elastomer (b-1) is preferably a thermoplastic elastomer which is a block copolymer having a polymer block formed from a monovinyl-substituted aromatic hydrocarbon and a polymer block formed from a conjugated diene.

Examples of the monovinyl-substituted aromatic hydrocarbon that constitutes the thermoplastic elastomer (b-1) include, but not limited to, styrene, t-butylstyrene, divinylbenzene, 1,1-diphenylstyrene, N,N-dimethyl-p-aminoethylstyrene, N,N-diethyl-p-aminoethylstyrene, vinylpyridine, p-methylstyrene, p-methoxystyrene, tertiary-butylstyrene, α-methylstyrene, and 1,1-diphenylethylene.

Styrene is preferable from the viewpoint of enabling the photosensitive resin composition layer (b) to be formed so as to be flat at a relatively low temperature.

These may be used singly or in combinations of two or more thereof.

Examples of the conjugated diene that constitutes the thermoplastic elastomer (b-1) include, but not limited to, butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene.

These may be used singly or in combinations of two or more thereof.

From the viewpoint of durability of the photosensitive resin structure for the flexographic printing plate according to the present embodiment, butadiene is preferable as the conjugated diene.

The thermoplastic elastomer (b-1) preferably has a number average molecular weight of 20,000 or more and 300,000 or less, more preferably 30,000 or more and 250,000 or less, and still more preferably 50,000 or more and 200,000 or less from the viewpoint of viscosity at normal temperature.

The number average molecular weight of the thermoplastic elastomer (b-1) can be measured by gel permeation chromatography (GPC) and is expressed by a molecular weight in terms of polystyrene.

When the thermoplastic elastomer (b-1) is a block copolymer having a polymer block formed from a monovinyl-substituted aromatic hydrocarbon and a polymer block formed from a conjugated diene, examples of the block copolymer that constitutes the thermoplastic elastomer (b-1) include linear block copolymers represented by the following formula group (I) and/or linear block copolymers or radial block copolymers represented by the following formula group (II).

$$(A\text{-}B)_n,\ A\text{-}(B\text{-}A)_n,\ A\text{-}(B\text{-}A)_n\text{-}B,\ B\text{-}(A\text{-}B)_n \quad \text{(I)}$$

$$[(A\text{-}B)_k]_m\text{-}X,\quad [(A\text{-}B)_k\text{-}A]_m\text{-}X,\quad [(B\text{-}A)_k]_m\text{-}X,\quad [(B\text{-}A)_k\text{-}B]_m\text{-}X \quad \text{(II)}$$

In the formula (I) and the formula (II), A represents a monomer unit derived from a monovinyl-substituted aromatic hydrocarbon. B represents a monomer unit derived from a conjugated diene. X represents a residual group of a coupling agent such as silicon tetrachloride, tin tetrachloride, epoxidized soybean oil, a poly(halogenated hydrocarbon) compound, a carboxylic acid ester compound, a polyvinyl compound, a bisphenol type epoxy compound, an alkoxysilane compound, a halogenated silane compound, or an ester-based compound, or a residual group of a polymerization initiator such as a multifunctional organolithium compound.

n, k, and m each represent an integer of at least one, for example, 1 to 5.

The content of the monomer unit derived from a conjugated diene and of the monomer unit derived from a monovinyl-substituted aromatic hydrocarbon in the thermoplastic elastomer (b-1) can be measured using a nuclear magnetic resonance apparatus (1H-NMR).

Specifically, the contents can be measured by using JNM-LA400 (manufactured by JEOL Ltd., trade name) as a $^1$H-NMR measurement device, using deuterated chloroform as a solvent, setting the sample concentration to 50 mg/mL, setting a measurement frequency at 400 MHz, using TMS (tetramethylsilane) as a standard of chemical shifts, and setting a pulse delay to 2.904 seconds, the number of times of scanning to 64, a pulse width to 45°, and a measurement temperature to 25° C.

The copolymerization ratio (mass ratio) of the monovinyl-substituted aromatic hydrocarbon to the conjugated diene in the thermoplastic elastomer (b-1) is preferably monovinyl-substituted aromatic hydrocarbon/conjugated diene=10/80 or more and 90/20 or less, more preferably 10/90 or more and 85/15 or less, and still more preferably 10/90 or more and 60/40 or less from the viewpoint of the hardness of the photosensitive resin composition layer (b) which constitutes the photosensitive resin structure for the flexographic printing plate according to the present embodiment.

When the proportion of the monovinyl-substituted aromatic hydrocarbon in the mass ratio is 10 or more, a sufficient hardness is obtained in the photosensitive resin composition layer (b), so that appropriate printing can be performed by usual printing pressure. When the proportion of the monovinyl-substituted aromatic hydrocarbon in the mass ratio is 90 or less, an appropriate hardness is obtained in the photosensitive resin composition layer (b), so that inks can be transferred to an object of printing sufficiently in the printing process.

If necessary, another functional group may be introduced, a chemical modification such as hydrogenation may be performed, or another component other than the monovinyl-substituted aromatic hydrocarbon and the conjugated diene may be copolymerized in the thermoplastic elastomer (b-1).

The content of the thermoplastic elastomer (b-1) in the photosensitive resin composition layer (b) is preferably 40% by mass or more, more preferably 40% by mass or more and 80% by mass or less, still more preferably 45% by mass or more and 80% by mass or less, and further still more preferably 45% by mass or more and 75% by mass or less when the whole amount of the photosensitive resin composition layer is assumed to be 100% by mass from the viewpoint of durability of a flexographic printing plate obtained using the photosensitive resin structure for the flexographic printing plate according to the present embodiment.

<Ethylenically Unsaturated Compound (b-2)>

The photosensitive resin composition layer (b) preferably contains an ethylenically unsaturated compound (b-2), as described above.

The ethylenically unsaturated compound (b-2) is a compound having a radically polymerizable unsaturated double bond.

Examples of the ethylenically unsaturated compound (b-2) include, but not limited to, olefins such as ethylene, propylene, vinyltoluene, styrene, and divinylbenzene; acetylenes; (meth)acrylic acid and/or derivatives thereof; haloolefins; unsaturated nitriles such as acrylonitrile; derivatives of acrylamide or methacrylamide; unsaturated dicarboxylic acids and derivatives thereof such as maleic anhydride, maleic acid, and fumaric acid; vinyl acetates; N-vinylpyrrolidone; N-vinylcarbazole; and N-substituted maleimide compounds.

Particularly, (meth)acrylic acid and/or derivatives thereof are preferable from the viewpoint of rich in variety.

Examples of the derivatives include, but not limited to, an alicyclic compound having a cycloalkyl group, a bicycloalkyl group, a cycloalkenyl group, a bicycloalkenyl group, or the like; an aromatic compound having a benzyl group, a phenyl group, a phenoxy group, a naphthalene skeleton, an anthracene skeleton, a biphenyl skeleton, a phenanthrene skeleton, a fluorene skeleton, or the like; a compound having an alkyl group, a halogenated alkyl group, an alkoxyalkyl group, a hydroxyalkyl group, an aminoalkyl group, a glycidyl group, or the like; an ester compound with a polyhydric alcohol such as an alkylene glycol, a polyoxyalkylene glycol, a polyalkylene glycol, or trimethylolpropane; and a compound having a polysiloxane structure, such as polydimethylsiloxane and polydiethylsiloxane. In addition, the derivative may be a heteroaromatic compound containing an element such as nitrogen or sulfur.

Examples of the (meth)acrylic acid and/or derivatives thereof include, but not limited to, a diacrylate and a dimethacrylate of an alkanediol such as hexanediol or nonanediol; a diacrylate and a dimethacrylate of ethylene glycol, diethylene glycol, propylene glycol, dipropylene glycol, polyethylene glycol, or butylene glycol; trimethylolpropane tri(meth)acrylate; dimethylol tricyclodecane di(meth)acrylate; isobornyl (meth)acylate; phenoxy polyethylene glycol (meth)acrylate; and pentaerythrit tetra(meth) acrylate.

These may be used singly or in combinations of two or more thereof.

From the viewpoint of the mechanical strength of a flexographic printing plate obtained using the photosensitive resin structure for the flexographic printing plate according to the present embodiment, at least one (meth)acrylate is preferably used, and at least one bifunctional (meth)acrylate is more preferably used as the ethylenically unsaturated compound (b-2).

The number average molecular weight (Mn) of the ethylenically unsaturated compound (b-2) is preferably 100 or more from the viewpoint of securing nonvolatility, preferably less than 1000 from the viewpoint of compatibility with the other components such as a resin in the photosensitive resin composition layer, and more preferably 200 or more and 800 or less.

The content of the ethylenically unsaturated compound (b-2) in the photosensitive resin composition layer (b) is preferably set to 2% by mass or more and 30% by mass or less, more preferably set to 2% by mass or more and 25% by mass or less, and still more preferably set to 2% by mass or more and 20% by mass or less when the whole amount of the photosensitive resin composition is assumed to be 100% by mass in the production process for the photosensitive resin composition layer (b) from the viewpoint of printing durability of a flexographic printing plate obtained using the photosensitive resin structure for the flexographic printing plate according to the present embodiment.

<Photopolymerization Initiator (b-3)>

The photosensitive resin composition layer (b) preferably contains a photopolymerization initiator (b-3).

The photopolymerization initiator (b-3) is a compound that absorbs the energy of light to produce a radical. Examples thereof include a degradable photopolymerization initiator, a hydrogen abstraction type photopolymerization initiator, and a compound having a site functioning as a hydrogen abstraction type photopolymerization initiator and a site functioning as a degradable photopolymerization initiator in the same molecule.

As the photopolymerization initiator (b-3), various organic carbonyl compounds can be used, and particularly, aromatic carbonyl compounds are suitable.

The content of the photopolymerization initiator (b-3) in the photosensitive resin composition layer (b) is preferably set to 0.1% by mass or more and 10% by mass or less, more preferably set to 0.1% by mass or more and 5% by mass or less, and still more preferably set to 0.5% by mass or more and 5% by mass or less when the whole amount of the photosensitive resin composition is assumed to be 100% by mass in the production process for the photosensitive resin composition layer (b) from the viewpoint of print durability of a flexographic printing plate produced using the photosensitive resin structure for the flexographic printing plate according to the present embodiment.

Examples of the photopolymerization initiator (b-3) include, but not limited to, benzophenones such as benzophenone, 4,4-bis(diethylamino) benzophenone, 3,3',4,4'-benzophenone tetracarboxylic anhydride, and 3,3',4,4'-tetramethoxy benzophenone; anthraquinones such as t-butyl anthraquinone and 2-ethyl anthraquinone; thioxanthones such as 2,4-diethyl thioxanthone, isopropyl thioxanthone, and 2,4-dichloro thioxanthone; Michler's ketone; acetophenones such as diethoxyacetophenone, 2,2-dimethoxy-phenylacetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one, 2-methyl-1-(4-methylthiophenyl)-2-morpholinopropan-1-one, 2-benzyl-2-dimethylamino-1-(4-morpholinophenyl)-butanone, and trichloroacetophenone; benzoin ethers such as benzoin methyl ether, benzoin ethyl ether, benzoin isopropyl ether, and benzoin isobutyl ether; acylphosphine oxides such as 2,4,6-trimethylbenzoyl diphenyl phosphine oxide, bis(2,6-dimethoxybenzoyl)-2,4,4-trimethyl pentyl phosphine oxide, and bis(2,4,6-trimethylbenzoyl)-phenyl phosphine oxide; methyl benzoylformate; 1,7-bisacridinyl heptane; 9-phenyl acridine; and azo compounds such as azobisisobutyronitrile, diazonium compounds, and tetrazene compounds.

These may be used singly or in combinations of two or more thereof.

<Liquid Diene>

The photosensitive resin composition layer (b) preferably contains a liquid diene.

The liquid diene is a liquid compound having a carbon-carbon double bond.

In the present specification, "liquid" in the "liquid diene" means a characteristic having the property of being easily flow-deformable and capable of being solidified into a deformed shape by cooling, and refers to the following property: when external force is applied, deformation occurs instantly depending on the external force, and when the external force is removed, the original shape is recovered in a short time.

Examples of the liquid diene include, but not limited to, liquid polybutadiene, liquid polyisoprene, a modified product of liquid polybutadiene, a modified product of liquid polyisoprene, a liquid acrylonitrile-butadiene copolymer, and a liquid styrene-butadiene copolymer. The liquid diene is defined as a copolymer having a diene component of 50% by mass or more.

The number average molecular weight of the liquid diene is not particularly limited as long as it is liquid at 20° C., but is preferably 500 or more and 60000 or less, more preferably 500 or more and 50000 or less, and still more preferably 800 or more and 50000 or less from the viewpoint of the mechanical strength and handling properties of a flexographic printing plate obtained using the photosensitive resin structure for the flexographic printing plate according to the present embodiment.

From the viewpoint of the mechanical properties of the photosensitive resin structure for the flexographic printing plate according to the present embodiment, and the mechanical properties of a flexographic printing plate using the same, liquid polybutadiene is preferable as the liquid diene.

The amount of a 1,2-vinyl bond in the liquid diene, preferably liquid polybutadiene, is preferably 1% or more and 80% or less, more preferably 5% or more and 70% or less, and still more preferably 5% or more and 65% or less from the viewpoint of making the hardness of the photosensitive resin structure for the flexographic printing plate according to the present embodiment, and the hardness of a flexographic printing plate using the same appropriate.

The amount of the 1,2-vinyl bond is a proportion of a conjugated diene monomer incorporated by a 1,2-bond in conjugated diene monomers incorporated by bonding forms of the 1,2-bond, a 3,4-bond, and a 1,4-bond.

1,2-Polybutadiene, which is the liquid polybutadiene having the 1,2-vinyl bond, is highly reactive in radical polymerization and is preferable from the viewpoint of enhancing the hardness of the photosensitive resin composition layer (b) because vinyl, which has a double bond, forms a side chain.

The liquid polybutadiene is usually a mixture of 1,2-polybutadiene having the 1,2-vinyl bond and 1,4-polybutadiene having the 1,4-vinyl bond, and it is effective that 1,4-polybutadiene is contained in the liquid diene in order to improve the softness of the photosensitive resin structure for the flexographic printing plate according to the present embodiment, and the softness of a flexographic printing plate using the same. 1,4-Polybutadiene includes cis-1,4-polybutadiene and trans-1,4-polybutadiene. Any of cis- and trans-1,4-polybutadiene has a low reactivity in radical polymerization because a vinyl group, which has a double bond, exists inside, so that a soft resin can be produced finally.

When a plurality of liquid polybutadienes each having a different amount of the 1,2-vinyl bond are mixed and used, the average value of the amounts of the 1,2-vinyl bond is defined as the content of the 1,2-vinyl bond.

From the viewpoint of capable of adjusting the reactivity of the photosensitive resin composition layer (b) easily, the whole amount of the 1,2-vinyl bond is preferably adjusted by mixing liquid polybutadiene having an amount of the 1,2-vinyl bond of 10% or less and liquid polybutadiene having an amount of the 1,2-vinyl bond of 80% or more. The whole amount of the 1,2-vinyl bond is preferably adjusted by mixing liquid polybutadiene having an amount of the 1,2-vinyl bond of more preferably 5% or less and liquid polybutadiene having an amount of the 1,2-vinyl bond of 80% or more.

The amount of the 1,2-vinyl bond can be determined from the peak ratio of the $^{1}$H-NMR (nuclear magnetic resonance) of liquid polybutadiene.

The content of the liquid diene in the photosensitive resin composition layer (b) is preferably 10% by mass or more and 40% by mass or less, more preferably 15% by mass or more and 40% by mass or less, and still more preferably 20% by mass and 40% by mass or less when the whole amount of the photosensitive resin composition layer is assumed to be 100% by mass from the viewpoint of the mechanical strength of the photosensitive resin structure for the flexographic printing plate according to the present embodiment, and the mechanical strength of a flexographic printing plate using the same.

≤Auxiliary Additive Component>

The auxiliary additive component is not particularly limited, and examples thereof include a polar group-containing polymer, a plasticizer other than a liquid diene, a thermal polymerization inhibitor other than a stabilizer, an antioxidant, an ultraviolet ray absorber, and a dye/pigment.

Examples of the polar group-containing polymer include, but not limited to, a water-soluble or water-dispersible copolymer having a polar group such as a hydrophilic group, such as a carboxyl group, an amino group, a hydroxy group, a phosphate group, or a sulfate group, and a salt thereof. More specific examples thereof include carboxyl group-containing NBR, carboxyl group-containing SBR, a polymer of a carboxyl group-containing aliphatic conjugated diene, an emulsified polymer of an ethylenically unsaturated compound having a phosphate group or a carboxyl group, a sulfate group-containing polyurethane, and carboxyl group-containing butadiene latex.

From the viewpoint of obtaining a high resolution in a flexographic printing plate using the photosensitive resin structure for the flexographic printing plate according to the present embodiment, carboxyl group-containing butadiene latex is preferable as the polar group-containing polymer.

These polar group-containing polymers may be used singly, or two or more thereof may be combined.

Examples of the plasticizer other than the liquid dienes include, but not limited to, hydrocarbon oils such as naphthene oil and paraffin oil; conjugated diene rubbers mainly composed of a liquid diene, such as a liquid acrylonitrile-butadiene copolymer and a liquid styrene-butadiene copolymer; polystyrene having a number average molecular weight of 2000 or less, a sebacic acid ester, and a phthalic acid ester. These may have a hydroxyl group or a carboxyl group at an end thereof. In addition, a photopolymerizable, reactive group such as a (meth)acryloyl group may be added thereto.

These plasticizers may be used singly, or two or more thereof may be used together.

As the thermal polymerization inhibitor and the antioxidant, those usually used in the field of resin materials or rubber materials can be used.

Specific examples thereof include a phenol-based material.

Examples of the phenol-based material include, but not limited to, vitamin E, tetrakis-(methylene-3-(3',5'-di-t-butyl-4'-hydroxyphenyl)propionate)methane, 2,5-di-t-butylhydroquinone, 2,6-di-t-butyl-p-cresol, and 2-t-butyl-6-(3-t-butyl-2-hydroxy-5-methylbenzyl)-4-methylphenyl acrylate.

These inhibitors of thermal polymerization and antioxidants may be used singly or in combinations of two or more thereof.

Examples of the ultraviolet ray absorber include known benzophenone-based, salicylate-based, acrylonitrile-based, metal complex-based, or hindered amine-based compounds. The dye/pigment described below may also be used as the ultraviolet ray absorber.

Examples of the ultraviolet ray absorber include, but not limited to, 2-ethoxy-2'-ethyloxalic acid bisanilide, and 2,2'-dihydroxy-4-methoxybenzophenone.

The dye/pigment is effective as coloring means for improving visibility.

Examples of the dye include, but not limited to, a basic dye, an acid dye, and a direct dye, which are water-soluble, and a sulfur dye, an oil-soluble dye, and a disperse dye, which are non-water-soluble. Particularly, a dye having an anthraquinone-based, indigoid-based, or azo-based structure is preferable, and an azo-based oil-soluble dye, or the like is more preferably used.

Examples of the pigment include, but not limited to, a natural pigment, a synthetic inorganic pigment, and a synthetic organic pigments, and examples of the synthetic organic pigment include an azo-based, triphenylmethane-based, quinoline-based, anthraquinone-based, or phthalocyanine-based pigment.

The amount of the total components of the above-described auxiliary additive components to be added in the photosensitive resin composition layer (b) is preferably 0% by mass or more and 10% by mass or less, more preferably 0% by mass or more and 5% by mass or less, and still more preferably 0% by mass or more and 3% by mass or less when the whole amount of the photosensitive resin composition layer (b) is assumed to be 100% by mass.

(Infrared Ray Ablation Layer (c))

The photosensitive resin structure for the flexographic printing plate according to the present embodiment contains an infrared ray ablation layer (c) which is laminated on the above-described photosensitive resin composition layer (b).

The infrared ray ablation layer (c) contains a resin and carbon black, is ablatable with an infrared laser, and has a function as a layer shielding a light beam other than infrared ray.

For high-definition processing of the infrared ray ablation layer (c), it is necessary to improve the sensitivity of the infrared ray ablation layer (c) to laser. The laser sensitivity herein means a volume which is more ablated, particularly, largely ablated in the depth direction, in drawing with the same laser energy.

A smaller primary particle diameter of the carbon black is effective for improving the laser sensitivity of the infrared ray ablation layer (c). This is because the smaller primary particle diameter of the carbon black increases the surface area of the carbon black. The carbon black surface receives infrared laser that has penetrated the resin, and converts its energy to heat to elevate the temperature of the resin. The increased surface area of the carbon black increases the area of the carbon black that receives the laser, and also increases the area of the resin/carbon black interface, so that the energy of the laser can be efficiently transmitted as heat to the resin to improve laser sensitivity.

On the other hand, the smaller primary particle diameter of the carbon black is not sufficiently effective for laser sensitivity, and the type of the resin is also important for exerting the maximum effect, as will be described later.

In the photosensitive resin structure for the flexographic printing plate according to the present embodiment, the carbon black in the infrared ray ablation layer (c) has a primary particle diameter of 13 nm or larger and 25 nm or smaller.

As described above, a smaller primary particle diameter of the carbon black basically tends to elevate laser sensitivity. When the primary particle diameter of the carbon black is 13 nm or larger, the self-aggregation force among the carbon black particles can be prevented from becoming too large, so that good dispersibility is obtained and thus, higher laser sensitivity is obtained. When the primary particle diameter is 25 nm or smaller, the desired high laser sensitivity can be obtained, so that high-definition images can be obtained.

For more simply and stably obtaining the infrared ray ablation layer (c), it is preferable that the primary particle diameter of the carbon black should not be too small. The primary particle diameter of the carbon black is preferably 15 nm or larger and 25 nm or smaller.

The primary particle diameter of the carbon black is more preferably 15 nm or larger and 23 nm or smaller, and still more preferably 15 nm or larger and 20 nm or smaller from the viewpoint of excellent infrared ray ablation layer-removing properties at the interface with the photosensitive resin composition layer (b) after laser ablation. The excellent infrared ray ablation layer-removing properties at the interface with the photosensitive resin composition layer (b) can impart even shielding properties for a light beam other than infrared ray and a better shape to a photosensitive resin structure for a flexographic printing plate, and a flexographic printing plate can be obtained using the same.

The primary particle diameter of the carbon black contained in the infrared ray ablation layer (c) can be determined by observation under an electron microscope. The primary particle diameter can be determined by a method described in Examples.

The primary particle diameter of the carbon black contained in the infrared ray ablation layer (c) can be controlled in the above-described numerical value range by selecting carbon black having an appropriate particle diameter from various commercially available products.

The carbon black preferably has a small structure. The small structure increases the contact area between the carbon black and the resin, achieves improvement in infrared laser sensitivity by improvement in dispersibility, and further achieves improvement in adhesion between the infrared ray ablation layer (c) and the photosensitive resin composition layer (b).

Specifically, the DBP absorption number of the carbon black is preferably 40 $cm^3$/100 g or more and 80 $cm^3$/100 g or less, more preferably 50 $cm^3$/100 g or more and 80

$cm^3/100$ g or less, still more preferably 55 $cm^3/100$ g or more and 80 $cm^3/100$ g or less. The above-described effect is found in this range.

The DBP absorption number is the amount of DBP (dibutyl phthalate) absorbed by 100 g of carbon black, and can be measured by the method stipulated in JIS K6217-4. Specifically, the DBP absorption number can be measured by a method described in Examples. The carbon black has a larger value of the DBP absorption number when having a larger structure and has a smaller value thereof when having a smaller structure.

The DBP absorption number of the carbon black contained in the infrared ray ablation layer (c) can be controlled in the above-described numerical value range by selecting carbon black having an appropriate value from various commercially available products.

The carbon black contained in the infrared ray ablation layer (c) preferably has pH of 6.0 or higher and 8.5 or lower. In this range, the carbon black has excellent compatibility with the resin and has improved dispersibility, so that infrared laser sensitivity is improved.

The pH of the carbon black is more preferably 6.5 or higher and 8.0 or lower, and still more preferably 7.0 or higher and 8.0 or lower.

The pH of the carbon black can be measured by preparing a mixed liquid of the carbon black and distilled water, and using a pH meter equipped with glass electrodes. Specifically, the pH can be measured in accordance with ASTM D1512.

The pH of the carbon black contained in the infrared ray ablation layer (c) can be controlled in the above-described numerical value range by selecting carbon black having an appropriate pH value from various commercially available products.

The carbon black is classified, depending on its production method, into, for example, furnace black, channel black, thermal black, acetylene black, and lamp black, and furnace black is preferable for obtaining the desired characteristics.

The furnace black is carbon black obtained by blowing a petroleum-based or coal-based oil as a starting material into a high-temperature gas, followed by incomplete combustion, and can be produced by use of a widely known method.

As the carbon black, carbon black that has heretofore been used for forming black matrix can be used in a range that satisfies the above-described various conditions. Specific examples thereof include #44, #45L, #47, MCF88, #850, #900, #950, #960, #980, #2300, and #2600 manufactured by Mitsubishi Chemical Corporation, and SEAST 600, TOKABLACK #8300, and TOKABLACK #7550 manufactured by Tokai Carbon Co., Ltd.

From the viewpoint of keeping carbon black dispersibility high, and obtaining high laser sensitivity, the resin of the infrared ray ablation layer (c) contains a copolymer of a monovinyl-substituted aromatic hydrocarbon and a conjugated diene, or a hydrogenated copolymer of a monovinyl-substituted aromatic hydrocarbon and a conjugated diene.

The content of the copolymer of a monovinyl-substituted aromatic hydrocarbon and a conjugated diene, or the hydrogenated copolymer of a monovinyl-substituted aromatic hydrocarbon and a conjugated diene in the resin is preferably 30% by mass or more and 100% by mass or less, more preferably 50% by mass or more and 100% by mass or less, still more preferably 70% by mass or more and 100% by mass or less, and further still more preferably 90% by mass or more and 100% by mass or less from the viewpoint of obtaining the above-described effect.

The dispersibility of the carbon black in the resin tends to be deteriorated even if their polarities are too close or too different. The photosensitive resin structure for the flexographic printing plate according to the present embodiment is excellent in the dispersibility of the carbon black in the resin, and also has higher infrared laser sensitivity as compared with the case of using another resin. This is presumably because of an appropriate distance between the polarities of the resin and the carbon black.

From such a viewpoint, a combination of the resin and the carbon black for use in the infrared ray ablation layer (c) is important.

A Hansen solubility parameter can be used as an index for the combination of the resin and the carbon black for use in the infrared ray ablation layer (c).

For improving the dispersibility of the carbon black in the resin, the distance between the HSP (Hansen solubility parameter) (hereinafter, also referred to as "HSP") values of the resin and the carbon black is important.

The Hansen solubility parameter (HSP) is a value that was published by Charles M. Hansen in 1967 and is used in the prediction of solubilities of substances, and is a parameter based on the idea that "two substances similar in interaction between molecules are soluble in each other".

HSP is composed of three parameters (unit: $MPa^{0.5}$).

δd: energy from dispersion force between molecules

δp: energy from dipolar interaction between molecules

δh: energy from a hydrogen bond between molecules

These three parameters can be regarded as coordinates in a three-dimensional space (Hansen space), and when the HSP values of two substances are placed in the Hansen space, a closer distance between the two points indicates that the substances are more soluble in each other. As described in Chemical Industry, March 2010 (Kagaku Kogyosha Inc.), etc., the Hansen solubility parameters of various substances can be obtained using personal computer software "HSPiP: Hansen Solubility Parameters in Practice" or the like.

In the photosensitive resin structure for the flexographic printing plate according to the present embodiment, a Hansen solubility parameter obtained using the personal computer software "HSPiP: Hansen Solubility Parameters in Practice" is used.

In the present embodiment, R in the expression (1): $R=(4\alpha^2+\beta^2+\gamma^2)^{0.5}$ is preferably 11.0 or more and 13.0 or less, more preferably 11.0 or more and 12.5 or less, and still more preferably 11.0 or more and 12.5 or less.

In the expression (1), α, β, and γ are as defined below.

α=an absolute value of difference between δd of the resin and δd of the carbon black β=an absolute value of difference between δp of the resin and δp of the carbon black γ=an absolute value of difference between δh of the resin and δh of the carbon black When R determined according to the expression (1) falls within the above-described range, the dispersibility of the carbon black is improved and, particularly, the dispersibility of carbon black having a small particle diameter can be kept good, so that laser sensitivity can be elevated.

The Hansen solubility parameter (HSP value) of the resin and the Hansen solubility parameter (HSP value) of the carbon black in the infrared ray ablation layer can be controlled by selecting the composition of the resin and the type of the carbon black. As for the carbon black, its HSP value can be controlled by adjusting the polarity of the surface. Specifically, when the carbon black is allowed to have a high polarity (low pH) by an oxidation treatment, the HSP value of the carbon black is shifted to the high-polarity side. As the carbon black has a smaller particle diameter, there is a tendency that the HSP value of carbon black having a high polarity is shifted to a higher polarity while the HSP value of carbon black having a low polarity is shifted to a lower polarity.

The value of R in the expression (1) can be controlled in the above-described numerical value range by adjusting the HSP values of the resin and the carbon black.

Examples of the vinyl aromatic hydrocarbon compound for use in the copolymer of a monovinyl-substituted aromatic hydrocarbon and a conjugated diene (hereinafter, also referred to as the copolymer) contained in the resin in the infrared ray ablation layer include, but not limited to, monomers such as styrene, t-butylstyrene, divinylbenzene, 1,1-diphenylstyrene, N,N-dimethyl-p-aminoethylstyrene, N,N-diethyl-p-aminoethylstyrene, vinylpyridine, p-methoxystyrene, tertiary-butylstyrene, α-methylstyrene, and 1,1-diphenylethylene.

Particularly, styrene is preferable because of enabling the photosensitive resin structure for the flexographic printing plate to be formed so as to be flat at a relatively low temperature (hereinafter, referred to as high formability).

These monomers may be used singly or in combinations of two or more thereof.

Examples of the conjugated diene for use in the copolymer include, but not limited to, monomers such as 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene. Particularly, 1,3-butadiene is preferable from the viewpoint of abrasion resistance.

These monomers may be used singly or in combinations of two or more thereof.

The content or ratio of the monovinyl-substituted aromatic hydrocarbon in the copolymer can be measured using a nuclear magnetic resonance apparatus ($^1$H-NMR).

In the copolymer of a monovinyl-substituted aromatic hydrocarbon and a conjugated diene herein, when the monovinyl-substituted aromatic hydrocarbon is styrene, that is, when the copolymer is a styrene-conjugated diene copolymer, the content of the styrene is preferably 40% by mass or more and 80% by mass or less. In general, a higher ratio of the monovinyl-substituted aromatic hydrocarbon elevates infrared laser sensitivity, and a higher ratio of the conjugated diene offers better flexibility.

In the above-described range, the balance between infrared laser sensitivity and flexibility is excellent.

A hydrogenated copolymer of a monovinyl-substituted aromatic hydrocarbon and a conjugated diene may be used as the resin in the infrared ray ablation layer (c). In such a case, when the monovinyl-substituted aromatic hydrocarbon in the hydrogenated copolymer is styrene, that is, when the hydrogenated copolymer is a hydrogenated styrene-conjugated diene copolymer, the content of the styrene is preferably 30% by mass or more and 70% by mass or less. In general, a higher ratio of the monovinyl-substituted aromatic hydrocarbon elevates laser sensitivity. In the above-described range, the balance between laser sensitivity and flexibility tends to be excellent.

The content or ratio of the monovinyl-substituted aromatic hydrocarbon in the hydrogenated copolymer can be measured using a nuclear magnetic resonance apparatus ($^1$H-NMR).

In the infrared ray ablation layer (c), the mass ratio of the resin to the carbon black is preferably resin/carbon black=90/10 or more and 50/50 or less, more preferably 85/15 or more and 55/45 or less, and still more preferably 75/35 or more and 60/40 or less.

In the above-described range, the balance between infrared laser sensitivity and flexibility is excellent.

The film thickness of the infrared ray ablation layer (c) in the photosensitive resin structure for the flexographic printing plate according to the present embodiment is preferably larger from the viewpoint of securing shielding properties for ultraviolet ray in the step of subjecting the photosensitive resin structure for the flexographic printing plate to an exposure treatment, and is preferably smaller from the viewpoint of enhancing ablation properties.

From the above-described viewpoint, the film thickness of the infrared ray ablation layer (c) is preferably 0.1 μm or larger and 20 μm or smaller, more preferably 0.5 μm or larger and 15 μm or smaller, and still more preferably 1.0 μm or larger and 10 μm or smaller.

For the non-infrared ray-shielding effect of the infrared ray ablation layer (c), the optical density of the infrared ray ablation layer (c) is preferably 2 or more, and the optical density is more preferably 3 or more.

The optical density can be measured using D200-II Transmission Densitometer (manufactured by GretagMacbeth LLC). The optical density is so-called ISO visual, and the light to be measured is in a wavelength region on the order of 400 to 750 nm.

The infrared ray ablation layer (c) may contain a dispersant for the purpose of assisting in the dispersion of the carbon black.

The dispersant is preferably, for example, a compound having an adsorptive moiety capable of interacting with a surface functional group of an infrared ray absorber, and a resin-compatible moiety capable of being compatible with the resin.

Examples of the adsorptive moiety of the dispersant include, but not limited to, an amino group, an amide group, a urethane group, a carboxyl group, a carbonyl group, a sulfone group, and a nitro group. An amino group, an amide group, or a urethane group is preferable.

Examples of the resin-compatible moiety include, but not limited to, saturated alkyl, unsaturated alkyl, polyether, polyester, poly(meth)acryl, and polyol.

Examples of a method for forming the infrared ray ablation layer (c) include, but are not limited to, a method of first preparing a resin solution using a predetermined solvent, adding thereto carbon black and a dispersant to disperse the carbon black in the resin solution, then coating a cover film such as a polyester film with the resulting solution, and then laminating or press pressure-bonding this cover film to the photosensitive resin composition layer (b) for the transfer of a non-infrared ray-shielding layer ablatable with an infrared laser.

Examples of a method for dispersing the carbon black in the resin solution include, but not limited to, forced stirring with stirring blades, and stirring using ultrasonic waves or various mills. A method using these in combination is effective. Alternatively, a method of preliminarily kneading the resin, the carbon black, and the dispersant using an extruder or a kneader, and then dissolving the resultant in a solvent is also effective for obtaining good dispersibility of the carbon black. Also, the carbon black may be forcedly dispersed in the resin in a solution state.

The solvent for a solution, a dispersion, or the like for forming the film of the infrared ray ablation layer can be appropriately selected in consideration of the solubility of the resin or the carbon black to be used. The solvent may be used singly or as mixtures of two or more solvents.

For example, the volatilization rate of the solvent may be controlled by mixing a solvent having a low boiling point and a solvent having a high boiling point. This is effective because the film quality of the infrared ray ablation layer (c) can be improved.

Examples of the solvent for forming the film of the infrared ray ablation layer (c) include, but are not limited to, toluene, xylene, cyclohexane, methyl acetate, ethyl acetate, propyl acetate, butyl acetate, amyl acetate, methyl ethyl ketone, acetone, cyclohexanone, ethylene glycol, propylene glycol, ethanol, water, propylene glycol monomethyl ether, propylene glycol monomethyl ether acetate, dimethylacetamide, dimethylformamide, n-propyl alcohol, i-propyl alcohol, 1,4-dioxane, tetrahydrofuran, diethyl ether, n-hexane, n-heptane, n-pentane, acetonitrile, and analogs thereof.

A cover film can be used for forming the film of the infrared ray ablation layer (c) in the photosensitive resin structure for the flexographic printing plate according to the present embodiment. The cover film is preferably a film excellent in dimensional stability and is preferably, for example, a polyethylene terephthalate film.

If necessary, a cover film having a function conferred by a mold release treatment, an antistatic treatment, or the like may be used.

A method described in Examples which will be described later can be applied to a method for forming the film of the infrared ray ablation layer using the cover film.

[Method for Producing Flexographic Printing Plate]

Suitable examples of a method for producing a flexographic printing plate according to the present embodiment include the following method.

The method uses the above-described photosensitive resin structure for the flexographic printing plate according to the present embodiment, and contains: a first step of performing ultraviolet ray irradiation from the side of the support (a); a second step of drawing and processing a pattern on the infrared ray ablation layer (c) by infrared ray irradiation; a third step of irradiating the photosensitive resin composition layer (b) with an ultraviolet ray for pattern exposure; and a fourth step of removing the infrared ray ablation layer (b) and an unexposed photosensitive resin composition layer (c).

If necessary, the step of performing a post-exposure treatment is then performed to obtain a flexographic printing plate (letterpress printing plate) formed from a cured photosensitive resin composition layer.

The surface of the flexographic printing plate may be brought into contact with a liquid containing a silicone compound and/or a fluorine compound from the viewpoint of conferring peeling properties.

The method for producing the flexographic printing plate according to the present embodiment is not limited to the above-described method. Particularly, the first to third steps may be appropriately shuffled or performed in parallel.

The first step of performing ultraviolet ray irradiation from the side of the support (a) can be performed using a conventional irradiation unit.

As the ultraviolet ray, an ultraviolet ray having a wavelength of 150 to 500 nm can be used, and, particularly, an ultraviolet ray at 300 to 400 nm can be preferably used.

As the light source, for example, a low-pressure mercury lamp, a high-pressure mercury lamp, an ultrahigh-pressure mercury lamp, a metal halide lamp, a xenon lamp, a zirconium lamp, a carbon arc lamp, or a fluorescent lamp for ultraviolet ray can be used.

This first step of performing ultraviolet ray irradiation may be performed before the second step of drawing and processing a pattern on the infrared ray ablation layer (c) or after the second step of drawing and processing a pattern.

When a cover film is used, as described above, in forming the film of the infrared ray ablation layer (c), the photosensitive resin structure for the flexographic printing plate is obtained by laminating this infrared ray ablation layer (c) with the photosensitive resin composition layer. Therefore, the layer constitution of the photosensitive resin structure for the flexographic printing plate is cover film/infrared ray ablation layer/photosensitive resin composition layer.

When the cover film is thus located on the infrared ray ablation layer, the cover film is first peeled before drawing and processing.

Thereafter, the infrared ray ablation layer (c) is irradiated to be patterned with an infrared ray, thereby forming a mask on the photosensitive resin composition layer (b).

Suitable examples of the infrared laser include ND/YAG laser (for example, 1064 nm) or diode laser (for example, 830 nm).

Laser systems suitable for CTP plate making techniques are sold on the market, and, for example, a diode laser system CDI Spark (ESKO GRAPHICS bvba.) can be used.

This laser system includes: a rotary cylindrical drum that holds the photosensitive resin structure for the flexographic printing plate; an infrared laser irradiation apparatus; and a layout computer, and image information is directly sent from the layout computer to the laser apparatus.

After a pattern is drawn and processed on the infrared ray ablation layer, as described above, the whole surface of the photosensitive resin composition layer (b) is irradiated with an ultraviolet ray via a mask.

The ultraviolet ray irradiation can be performed in a state where the photosensitive resin structure for the flexographic printing plate is attached to a laser cylinder, and is generally performed by taking the photosensitive resin structure for the flexographic printing plate out of a laser apparatus, and using a conventional irradiation unit.

The same irradiation unit as the one used in the ultraviolet ray irradiation from the side of the support (a) can be used as the irradiation unit.

Next, a development step is performed.

A conventionally known method can be applied to the development step.

Specific examples thereof include a development method of washing away an unexposed portion using a solvent for solvent development or a washing liquid for water development, and a development method of heating an unexposed portion to 40° C. or higher and 200° C. or lower, bringing the heated unexposed portion into contact with an absorption layer capable of absorbing it, and removing the unexposed portion through absorption by the absorption layer, thereby getting rid of the unexposed portion (hereinafter, referred to as heat development).

If necessary, a post-exposure treatment is then performed, thereby producing a flexographic printing plate.

When an intermediate layer such as an adhesive layer or an oxygen inhibition layer is located between the infrared ray ablation layer and the photosensitive resin composition layer, this layer is also gotten rid of by the development step.

Examples of the developing solvent for performing development by washing away the unexposed portion include, but not limited to, esters such as heptyl acetate and 3-methoxybutyl acetate; hydrocarbons such as petroleum fractions, toluene, and decaline; and mixtures obtained by mixing an alcohol such as propanol, butanol, or pentanol with a chlorine-based organic solvent such as tetrachloroethylene. In washing away the unexposed portion, the washing may be performed, for example, by a jet from a nozzle or may be performed by brushing.

For example, an alkaline aqueous solution or a neutral aqueous solution can be used as the washing liquid for water development.

A surfactant can be suitably used in the washing liquid for water development.

Examples of the surfactant include an anionic surfactant, an amphoteric surfactant, and a nonionic surfactant. These may be used singly or as mixtures of two or more thereof.

Examples of the anionic surfactant include, but not limited to, a sulfuric acid ester salt, a higher alcohol sulfuric acid ester, a higher alkyl ether sulfuric acid ester salt, a sulfated olefin, an alkylbenzenesulfonate, an α-olefin-sulfonate, a phosphoric acid ester salt, and dithiophosphoric acid ester salt.

Examples of the amphoteric surfactant include, but not limited to, an amino acid type amphoteric surfactant and a betaine type amphoteric surfactant.

Examples of the nonionic surfactant include, but not limited to, polyethylene glycol type surfactants such as an ethylene oxide adduct of a higher alcohol, an ethylene oxide adduct of an alkylphenol, an ethylene oxide adduct of an aliphatic acid, an ethylene oxide adduct of a polyhydric alcohol aliphatic acid ester, an ethylene oxide adduct of a higher alkylamine, an ethylene oxide adduct of an aliphatic acid amide, and an ethylene oxide adduct of polypropylene glycol, and polyhydric alcohol type surfactants such as an aliphatic acid ester of glycerol, an aliphatic acid ester of pentaerythritol, an aliphatic acid ester of sorbitol and of sorbitan, an alkyl ether of a polyhydric alcohol, and an aliphatic acid amide of an alkanolamine.

The alkaline aqueous solution may be prepared using a pH modifier.

The pH modifier may be any of organic materials and inorganic materials, and preferably enables pH to be adjusted to 9 or higher. Examples of the pH modifier include, but not limited to, sodium hydroxide, sodium carbonate, potassium carbonate, sodium silicate, sodium metasilicate, and sodium succinate.

Examples of the absorption layer which absorbs the unexposed portion for use in performing the heat development include, but not limited to, a nonwoven fabric material, a paper material, a fiber fabric, a fiber knit, an open-celled foam, and a porous material.

The absorption layer is preferably a nonwoven fabric material containing nylon, polyester, polypropylene or polyethylene, or a combination of these nonwoven fabric materials.

The absorption layer is particularly preferably a continuous nonwoven fabric web of nylon or polyester.

EXAMPLES

Hereinafter, the present invention will be described more specifically with reference to specific Examples and Comparative Examples, but the present invention is not limited to the following examples by any means.

[Method for Measuring Hansen Solubility Parameter (HSP)]

Hansen solubility parameters were measured using the personal computer software HSPiP.

For the HSP measurement of a resin in an infrared ray ablation layer, acetone, 2-butanol, cyclohexanone, ethanol, ethyl acetate, hexane, butyl acetate, isobutyl acetate, MEK (methyl ethyl ketone), propylene glycol 1-monomethyl ether 2-acetate (PMA), THF (tetrahydrofuran), toluene, and xylene were used as solvents, and 10 g of each solvent was added to a 20 mL vial and mixed with 0.1 g of the resin. Thereafter, the presence or absence of undissolved residues was confirmed after a lapse of 24 hours, and a dissolved state was determined when the undissolved residues were absent. Subsequently, the results were input using the Sphere program, and HSP was determined by calculation on the software.

For the HSP measurement of carbon black, the same solvents as those in the measurement of the resin in the infrared ray ablation layer were also used, and 10 g of each solvent was added to a 20 mL vial and mixed with 0.1 g of the carbon black, followed by light manual shaking of the vial. After the vial was then left standing for 30 minutes, the presence or absence of black turbidity was confirmed, and a dispersed state was determined when turbidity was seen. Subsequently, HSP was determined in the same manner as in the resin.

The value of R was calculated according to the following expression (1):

$$R=(4\alpha^2+\beta^2+\gamma^2)^{0.5} \quad \text{Expression (1)}$$

α=an absolute value of difference between δd of the resin and δd of the carbon black β=an absolute value of difference between δp of the resin and δp of the carbon black γ=an absolute value of difference between δh of the resin and δh of the carbon black δd: energy from dispersion force between molecules δp: energy from dipolar interaction between molecules δh: energy from a hydrogen bond between molecules

[Method for Measuring pH of Carbon Black]

The pH of carbon black was measured in accordance with ASTM D1512.

[Styrene Content of Resin]

The styrene content of a resin constituting the infrared ray ablation layer was measured in the manner as described below.

The styrene content was measured using a nuclear magnetic resonance apparatus ($^1$H-NMR) "JNM-LA400" (manufactured by JEOL Ltd.) under the conditions given below. Deuterated chloroform was used as a solvent, and the concentration of the resin was adjusted to 50 mg/mL.

Observation frequency: 400 MHz
Chemical shift reference: TMS (tetramethylsilane)
Pulse delay: 2.904 sec
The number of scans: 64
Pulse width: 45°
Measurement temperature: 26° C.

[Primary Particle Diameter Evaluation of Carbon Black]

A photosensitive resin structure for a flexographic printing plate was cut into an appropriate size and then resin-embedded using an ultraviolet curable resin. A section prepared by the cryomicrotome method after the resin embedding was used as a SEM observation material.

<Section Processing Conditions>

Apparatus used: Ultramicrotome UC6 (manufactured by LEICA Camera AG)
Set temperature: −80° C.
Set cutting thickness: 100 nm <SEM Observation Conditions>

Measurement apparatus: Scanning Electron Microscope S4800 (manufactured by Hitachi, Ltd.)
Acceleration voltage: 1.0 kV
Observation magnification: 5000×

The minor axis lengths of particle diameters of arbitrary 10 particles of the carbon black were measured from the obtained SEM observation image of the section, and the average value (number average) thereof was regarded as the primary particle diameter of the carbon black.

[DBP Absorption Number of Carbon Black]

The DBP absorption number of carbon black was measured by the method stipulated in JIS K6217-4.

[Production of Photosensitive Resin Structure for Flexographic Printing Plate]

A photosensitive resin structure for a flexographic printing plate was produced in Examples and Comparative Examples described below.

((1) Production of Laminate of Support and Photosensitive Resin Composition Layer)

60 parts by mass of a styrene-butadiene-styrene block copolymer (manufactured by Asahi Kasei Corp., trade name: TUFPRENE A), 30 parts by mass of liquid polybutadiene (manufactured by Nippon Petrochemicals Co., Ltd., trade name: B-2000), 7 parts by mass of 1,9-nonanediol diacrylate, 2 parts by mass of 2,2-dimethoxy-2-phenylacetophenone, and 0.3 parts by mass of 2,6-di-t-butyl-p-cresol were kneaded using a pressure kneader to prepare a photosensitive resin composition.

Next, the photosensitive resin composition was added to an extruder. Then, to one side of the photosensitive resin composition extruded from a T-die was laminated a base film (support), and to the side opposite to the support-laminated side of the photosensitive resin composition layer was laminated a release film (manufactured by Mitsubishi Chemical Corporation, trade name: DIAFOIL MRV100), to thereby obtain a laminate of the support and the photosensitive resin composition layer.

((2) Production of Infrared Ray Ablation Layer Laminate)

<Production Example of Infrared Ray Ablation Layer Laminate 1>

Hydrogenated styrene-butadiene-styrene copolymer elastomer (manufactured by Asahi Kasei Corp., trade name: TUFTEC H1051): 7.8 parts by mass Toluene: 70.4 parts by mass Propylene glycol 1-monomethyl ether-2-acetate (PMA): 17.6 parts by mass The above-described materials were mixed, and the resin was dissolved, followed by addition of carbon black (manufactured by Mitsubishi Chemical Corporation, trade name: #850). Thereafter, the mixture was mixed for 4 hours using a bead mill to obtain a carbon black dispersion.

A 100 μm thick PET film serving as a cover film was coated with the carbon black dispersion so that the film thickness after drying was 10 μm. A drying treatment at 90° C. for 2 minutes was performed to obtain infrared ray ablation layer laminate 1 which was a laminate of the infrared ray ablation layer and the cover film.

The materials constituting the infrared ray ablation layer laminate 1 and the physical properties thereof are shown in Table 1 below.

<Production Example of Infrared Ray Ablation Layer Laminates 2 to 21, 25, and 26>

Infrared ray ablation layer laminates 2 to 21, 25, and 26 were obtained in the same manner as in the infrared ray ablation layer laminate 1 except that the types of the resin and the carbon black used, and their respective mixing ratios were changed as shown in Table 1 below.

The materials constituting these laminates and the physical properties thereof are shown in Table 1 below.

<Production Example of Infrared Ray Ablation Layer Laminate 22>

Polyamide (manufactured by Henkel AG & Co. KGaA, trade name: MACROMELT 6900): 7.8 parts by mass Toluene: 44.0 parts by mass 2-Propanol: 44.0 parts by mass The above-described materials were mixed, and the resin was dissolved, followed by addition of carbon black (manufactured by Mitsubishi Chemical Corporation, trade name: #40). Thereafter, the mixture was mixed for 4 hours using a bead mill to obtain a carbon black dispersion.

A 100 μm thick PET film serving as a cover film was coated with the carbon black dispersion so that the film thickness after drying was 10 μm. A drying treatment at 90° C. for 2 minutes was performed to obtain infrared ray ablation layer laminate 22 which was a laminate of the infrared ray ablation layer and the cover film.

The materials constituting this laminate and the physical properties thereof are shown in Table 1 below.

<Production Example of Infrared Ray Ablation Layer Laminate 23>

10 parts by mass of polyvinyl acetate having a degree of saponification of 78 to 82% by mol (manufactured by Nippon Synthetic Chemical Industry Co., Ltd., trade name: GOHSENOL KL-05), 10 parts by mass of E-caprolactam, 90 parts by mass of a nylon salt of N-(2-aminoethyl) piperazine and adipic acid, and 100 parts by mass of water were placed in a stainless autoclave and, after purging of the internal air with nitrogen gas, heated at 180° C. for 1 hour to prepare a water-soluble polyamide.

Subsequently, 10 parts by mass of a water soluble polyamide obtained by the removal of water were dissolved in 40 parts by mass of water, 20 parts by mass of methanol, 20 parts by mass of n-propanol, and 10 parts by mass of n-butanol to obtain a solution.

The solution was mixed with carbon black (manufactured by Mitsubishi Chemical Corporation, trade name: #40), which was then kneaded and dispersed using a three-roll mill to obtain a carbon black dispersion.

A 100 μm thick PET film serving as a cover film was coated with the carbon black dispersion so that the film thickness after drying was 10 μm. A drying treatment at 90° C. for 2 minutes was performed to obtain infrared ray ablation layer laminate 23 which was a laminate of the infrared ray ablation layer and the cover film.

The materials constituting this laminate and the physical properties thereof are shown in Table 1 below.

<Production Example of Infrared Ray Ablation Layer Laminate 24>

Infrared ray ablation layer laminate 24 which was a laminate of the infrared ray ablation layer and the cover film was obtained in the same manner as in Production Example of the infrared ray ablation layer laminate 23 except that the carbon black was changed to carbon black (manufactured by Mitsubishi Chemical Corporation, trade name: MA100).

The materials constituting this laminate and the physical properties thereof are shown in Table 1 below.

TABLE 1

| | Resin | | | Carbon black | | | | | | |
|---|---|---|---|---|---|---|---|---|---|---|
| | Type | Styrene content (% by mass) | HSP (δd, δp, δh) | Type | Primary particle diameter (nm) | DBP absorption number (cm3/ 100 g) | pH | HSP (δd, δp, δh) | Resin/ carbon black mass ratio | R |
| Infrared ray ablation layer laminate 1 | TUFTEC H1051 | 42 | (17.7, 2.3, 2.6) | #850 | 17 | 77 | 8.0 | (17.9, 8.6, 12.9) | 65/35 | 12.0 |
| Infrared ray ablation layer laminate 2 | TUFTEC H1051 | 42 | (17.7, 2.3, 2.6) | MCF88 | 19 | 55 | 8.0 | (17.9, 8.6, 12.9) | 65/35 | 12.0 |
| Infrared ray ablation layer laminate 3 | TUFTEC H1051 | 42 | (17.7, 2.3, 2.6) | #2600 | 13 | 69 | 6.5 | (17.9, 8.6, 12.9) | 65/35 | 12.0 |
| Infrared ray ablation layer laminate 4 | TUFTEC H1051 | 42 | (17.7, 2.3, 2.6) | #45L | 24 | 45 | 8.0 | (14.9, 8.0, 13.0) | 65/35 | 13.1 |
| Infrared ray ablation layer laminate 5 | TUFTEC H1051 | 42 | (17.7, 2.3, 2.6) | #950 | 16 | 79 | 7.5 | (17.9, 8.6, 12.9) | 65/35 | 12.0 |
| Infrared ray ablation layer laminate 6 | TUFTEC H1051 | 42 | (17.7, 2.3, 2.6) | #40 | 24 | 110 | 7.5 | (14.9, 8.0, 13.0) | 65/35 | 13.1 |
| Infrared ray ablation layer laminate 7 | TUFTEC H1051 | 42 | (17.7, 2.3, 2.6) | #1000 | 18 | 56 | 3.5 | (17.9, 8.6, 12.9) | 65/35 | 12.0 |
| Infrared ray ablation layer laminate 8 | TUFTEC H1051 | 42 | (17.7, 2.3, 2.6) | Manufactured by Denka Co., Ltd., FX-35 | 23 | 150 | 9.0 | (18.4, 11.3, 13.3) | 65/35 | 14.0 |
| Infrared ray ablation layer laminate 9 | ASAFLEX 815 | 77 | (16.6, 3.8, 2.7) | #950 | 16 | 79 | 7.5 | (17.9, 8.6, 12.9) | 65/35 | 11.2 |
| Infrared ray ablation layer laminate 10 | TUFPRENE A | 40 | (16.6, 3.8, 2.7) | #950 | 16 | 79 | 7.5 | (17.9, 8.6, 12.9) | 65/35 | 11.2 |
| Infrared ray ablation layer laminate 11 | ASAPRENE T411 | 30 | (16.6, 3.8, 2.7) | #950 | 16 | 79 | 7.5 | (17.9, 8.6, 12.9) | 65/35 | 11.2 |
| Infrared ray ablation layer laminate 12 | TUFTEC H1043: 4.2 parts H1051: 3.6 parts | 56 | (17.7, 2.3, 2.6) | #950 | 16 | 79 | 7.5 | (17.9, 8.6, 12.9) | 65/35 | 12.0 |
| Infrared ray ablation layer laminate 13 | TUFTEC H1043 | 67 | (17.7, 2.3, 2.6) | #950 | 16 | 79 | 7.5 | (17.9, 8.6, 12.9) | 65/35 | 12.0 |
| Infrared ray ablation layer laminate 14 | TUFTEC H1041 | 30 | (17.7, 2.3, 2.6) | #950 | 16 | 79 | 7.5 | (17.9, 8.6, 12.9) | 65/35 | 12.0 |
| Infrared ray ablation layer laminate 15 | TUFTEC H1052 | 20 | (17.7, 2.3, 2.6) | #950 | 16 | 79 | 7.5 | (17.9, 8.6, 12.9) | 65/35 | 12.0 |
| Infrared ray ablation layer laminate 16 | TUFTEC H1051 | 42 | (17.7, 2.3, 2.6) | #950 | 16 | 79 | 7.5 | (17.9, 8.6, 12.9) | 75/25 | 12.0 |
| Infrared ray ablation layer laminate 17 | TUFTEC H1051 | 42 | (17.7, 2.3, 2.6) | #950 | 16 | 79 | 7.5 | (17.9, 8.6, 12.9) | 85/15 | 12.0 |
| Infrared ray ablation layer laminate 18 | TUFTEC H1051 | 42 | (17.7, 2.3, 2.6) | #950 | 16 | 79 | 7.5 | (17.9, 8.6, 12.9) | 90/10 | 12.0 |
| Infrared ray ablation layer laminate 19 | TUFTEC H1051 | 42 | (17.7, 2.3, 2.6) | #950 | 16 | 79 | 7.5 | (17.9, 8.6, 12.9) | 60/40 | 12.0 |
| Infrared ray ablation layer laminate 20 | TUFTEC H1051 | 42 | (17.7, 2.3, 2.6) | #950 | 16 | 79 | 7.5 | (17.9, 8.6, 12.9) | 55/45 | 12.0 |
| Infrared ray ablation layer laminate 21 | TUFTEC H1051 | 42 | (17.7, 2.3, 2.6) | #950 | 16 | 79 | 7.5 | (17.9, 8.6, 12.9) | 50/50 | 12.0 |
| Infrared ray ablation layer laminate 22 | MACROMELT 6900 | — | (16.9, 4.9, 4.1) | MCF88 | 19 | 55 | 8.0 | (17.9, 8.6, 12.9) | 65/35 | 9.8 |
| Infrared ray ablation layer laminate 23 | Polyvinyl acetate/ water-soluble polyamide | — | (16.7, 8.8, 12.2) | MCF88 | 19 | 55 | 8.0 | (17.9, 8.6, 12.9) | 80/20 | 2.6 |
| Infrared ray ablation layer laminate 24 | Polyvinyl acetate/ water-soluble polyamide | — | (16.7, 8.8, 12.2) | MA100 | 24 | 100 | 3.5 | (18.4, 11.3, 13.3) | 80/20 | 4.3 |
| Infrared ray ablation layer laminate 25 | TUFTEC H1052 | 20 | (17.7, 2.3, 2.6) | #10 | 75 | 86 | 7.0 | (14.9, 8.0, 13.0) | 65/35 | 13.1 |
| Infrared ray ablation layer laminate 26 | TUFTEC H1052 | 20 | (17.7, 2.3, 2.6) | #30 | 30 | 113 | 8.0 | (14.9, 8.0, 13.0) | 65/35 | 13.1 |

((3) Production of Photosensitive Resin Structure for Flexographic Printing Plate)

<Preparation of Photosensitive Resin Structure 1 for Flexographic Printing Plate>

The release film was peeled from the laminate of the support and the photosensitive resin composition layer, and the infrared ray ablation layer laminate 1 was laminated in an environment with a temperature of 25° C. and a humidity of 40% so that the infrared ray ablation layer was in contact with the photosensitive resin composition layer to obtain photosensitive resin structure 1 for a flexographic printing plate.

<Preparation of Photosensitive Resin Structures 2 to 6, 9 to 20, 25, and 26 for Flexographic Printing Plates>

Photosensitive resin structures 2 to 6, 9 to 20, 25, and 26 for flexographic printing plates were obtained in the same manner as in the photosensitive resin structure 1 for the flexographic printing plate except that the types of their infrared ray ablation layer laminates were changed to the infrared ray ablation layer laminates 2 to 6, 9 to 20, 25, and 26, respectively.

<Preparation of Photosensitive Resin Structures 7, 8, and 21 to 24 for Flexographic Printing Plates>

First, the types of their infrared ray ablation layer laminates were changed to the infrared ray ablation layer laminates 7, 8, and 21 to 24, respectively, and lamination was performed in the same manner as in the infrared ray ablation layer laminate 1. Since the adhesion between the infrared ray ablation layer and the photosensitive resin composition layer was insufficient, the laminates were further disposed on a hot plate set to 120° C. so that the cover film side was in contact with the heating portion of the hot plate. The laminates were heated for 1 minute to obtain photosensitive resin structures 7, 8, and 21 to 24 for flexographic printing plates.

Example 1

The photosensitive resin structure 1 for the flexographic printing plate prepared in the manner as described above was evaluated as described below. The evaluation results are shown in Table 2 below.

The evaluation was conducted by cutting the photosensitive resin structure for the flexographic printing plate into 10 cm×15 cm, and peeling the cover film.

(Evaluation Method)

<Evaluation of Laser Sensitivity>

The photosensitive resin structure 1 for the flexographic printing plate was placed in Esko CDI SPARK2530, and laser drawing was performed with a test image having an image pattern that formed 4 pixels in total of 2×2 pixels at a resolution of 4000 dpi and laser intensity of 3.0 J.

Thereafter, the ablated portion was observed under a laser microscope (manufactured by Keyence Corp., trade name: VK-X100, 100× objective lens), and evaluation was made according to the criteria given below by using the maximum depth ablated with laser as an index value for laser sensitivity.

A: The maximum depth was 4.9 μm or more.

B: The maximum depth was 4.6 μm or more and less than 4.9 μm.

C: The maximum depth was 4.3 μm or more and less than 4.6 μm.

D: The maximum depth was 4.0 μm or more and less than 4.3 μm.

E: The maximum depth was less than 4.0 μm.

<Evaluation of Infrared Ray Ablation Layer-Removing Properties at Photosensitive Resin Composition Layer Interface>

The photosensitive resin structure 1 for the flexographic printing plate was placed in a digital flexo imager (manufactured by Esko-Graphics BV., trade name: CDI SPARK2530), and laser drawing was performed with a test image having an image pattern that formed 4 pixels in total of 2×2 pixels at a resolution of 4000 dpi and laser intensity of 5.0 J.

Thereafter, the ablated portion was observed under a laser microscope (VK-X100, manufactured by Keyence Corp.; 100× objective lens). The length of the portion ablated with laser on the infrared ray ablation layer surface and the length of the portion ablated with laser at the interface with the photosensitive resin composition layer were measured, and evaluation was made as described below by using the ratio of the length of the portion ablated with laser at the interface with the photosensitive resin composition layer to the length of the portion ablated with laser on the infrared ray ablation layer surface as an index for infrared ray ablation layer-removing properties at the photosensitive resin composition layer interface.

A: The ratio of the length of the portion ablated with laser at the interface with the photosensitive resin composition layer to the length of the portion ablated with laser on the infrared ray ablation layer surface was 0.55 or more.

B: The ratio of the length of the portion ablated with laser at the interface with the photosensitive resin composition layer to the length of the portion ablated with laser on the infrared ray ablation layer surface was 0.50 or more and less than 0.55.

C: The ratio of the length of the portion ablated with laser at the interface with the photosensitive resin composition layer to the length of the portion ablated with laser on the infrared ray ablation layer surface was 0.45 or more and less than 0.50.

D: The ratio of the length of the portion ablated with laser at the interface with the photosensitive resin composition layer to the length of the portion ablated with laser on the infrared ray ablation layer surface was 0.40 or more and less than 0.45.

E: The ratio of the length of the portion ablated with laser at the interface with the photosensitive resin composition layer to the length of the portion ablated with laser on the infrared ray ablation layer surface was less than 0.40.

<Pinhole (PH) Evaluation>

The infrared ray ablation layer laminate 1 was laminated at a temperature of 120° C. so that the infrared ray ablation layer was in contact with the photosensitive resin composition layer to obtain a sample.

After the cover film of the infrared ray ablation layer was removed, this sample was placed on a light table, and a site that appeared shiny when the sample was illuminated with the light table from below was determined as a pinhole.

In the infrared ray ablation layer, the number of pinholes having a major axis of 20 μm or larger in size was counted, and the average value thereof as well as the value of (pinholes/$m^2$) was calculated. Evaluation was made as described below.

A: The number of pinholes was less than 2 (pinholes/$m^2$) on average.

B: The number of pinholes was 2 (pinholes/$m^2$) or more and less than 5 (pinholes/$m^2$) on average.

C: The number of pinholes was 5 (pinholes/$m^2$) or more and less than 10 (pinholes/$m^2$) on average.

D: The number of pinholes was 10 (pinholes/$m^2$) or more and less than 20 (pinholes/$m^2$) on average.

E: The number of pinholes was 20 (pinholes/$m^2$) or more on average.

<Evaluation of Adhesion between Infrared Ray Ablation Layer and Photosensitive Resin Composition Layer>

As described above, the infrared ray ablation layer laminate 1 was laminated in an environment with a temperature of 25° C. and a humidity of 40% so that the infrared ray ablation layer was in contact with the photosensitive resin composition layer to obtain photosensitive resin structure 1 for a flexographic printing plate.

Evaluation was made on whether the above-described lamination alone attained sufficient adhesion between the infrared ray ablation layer and the photosensitive resin composition layer and whether the above-described lamination followed by further heating attained sufficient adhesion between them.

Also, the photosensitive resin structure 1 for the flexographic printing plate was bent at 90° starting near the center so that the infrared ray ablation layer faced inward. Thereafter, the resultant was further bent at 90° so that the support faced inward. This operation was repeated three times, and whether or not the infrared ray ablation layer peeled off the photosensitive resin composition layer was observed. Evaluation was made as described below.

A: The lamination in the environment with a temperature of 25° C. and a humidity of 40% attained sufficient adhesion, and no peeling occurred in the bending test.

C: The lamination followed by further heating produced sufficient adhesion, and no peeling occurred in the bending test.

E: Peeling occurred in the bending test.

<Evaluation of Flexibility>

The photosensitive resin structure 1 for the flexographic printing plate was bent at 180° starting near the center so that the support faced inward, that is, bent in a state where the inward portions of the support were in contact with each other. Thereafter, whether wrinkles occurred on the infrared ray ablation layer surface was observed. Evaluation was made as described below.

A: No wrinkle occurred.

B: Although a wrinkle occurred, only the end of the photosensitive resin structure for the flexographic printing plate was very slightly wrinkled.

C: A plurality of wrinkles occurred at the end of the photosensitive resin structure for the flexographic printing plate.

D: Wrinkles occurred at the end and near the center of the photosensitive resin structure for the flexographic printing plate.

E: Wrinkles occurred on the whole surface of the photosensitive resin structure for the flexographic printing plate.

Examples 2 to 21

The photosensitive resin structures 2 to 21 for flexographic printing plates were evaluated in the same manner as in Example 1 above. The evaluation results are shown in Table 2 below.

Comparative Examples 1 to 5

The photosensitive resin structures 22 to 26 for flexographic printing plates were evaluated in the same manner as in Example 1 above. The evaluation results are shown in Table 2 below.

TABLE 2

| Photosensitive resin structure for flexographic printing plate | | Laser sensitivity | Infrared ray ablation layer-removing properties | PH evaluation | Adhesion | Flexibility |
|---|---|---|---|---|---|---|
| Example 1 | 1 | A (4.9 μm) | A(0.57) | B | A | A |
| Example 2 | 2 | B (4.8 μm) | B(0.52) | B | A | A |
| Example 3 | 3 | B (4.7 μm) | A(0.55) | B | A | A |
| Example 4 | 4 | B (4.6 μm) | C(0.46) | B | A | A |
| Example 5 | 5 | A (5.0 μm) | A(0.58) | B | A | A |
| Example 6 | 6 | C (4.4 μm) | D(0.41) | B | A | A |
| Example 7 | 7 | C (4.5 μm) | B(0.50) | B | C | A |
| Example 8 | 8 | D (4.2 μm) | D(0.42) | B | C | A |
| Example 9 | 9 | A (5.1 μm) | A(0.59) | A | A | B |
| Example 10 | 10 | B (4.7 μm) | A(0.56) | B | A | A |
| Example 11 | 11 | C (4.4 μm) | B(0.54) | C | A | A |
| Example 12 | 12 | A (5.1 μm) | A(0.59) | A | A | A |
| Example 13 | 13 | A (5.3 μm) | A(0.60) | A | A | B |
| Example 14 | 14 | B (4.6 μm) | A(0.55) | B | A | A |
| Example 15 | 15 | C (4.3 μm) | B(0.53) | C | A | A |
| Example 16 | 16 | A (4.9 μm) | A(0.56) | B | A | A |
| Example 17 | 17 | B (4.7 μm) | A(0.55) | B | A | A |
| Example 18 | 18 | C (4.5 μm) | B(0.52) | B | A | A |
| Example 19 | 19 | A (4.9 μm) | A(0.55) | B | A | B |
| Example 20 | 20 | B (4.8 μm) | B(0.52) | B | A | C |
| Example 21 | 21 | C (4.5 μm) | C(0.48) | B | C | C |
| Comparative Example 1 | 22 | E (3.5 μm) | E(0.39) | C | E | A |
| Comparative Example 2 | 23 | E (3.6 μm) | E(0.38) | E | E | A |
| Comparative Example 3 | 24 | E (3.8 μm) | D(0.41) | C | E | A |
| Comparative Example 4 | 25 | E (2.1 μm) | E(0.31) | C | A | A |
| Comparative Example 5 | 26 | E (3.9 μm) | E(0.37) | C | A | A |

The present application is based on a Japanese Patent Application (Japanese Patent Application No. 2020-161734) filed with Japan Patent Office on Sep. 28, 2020, the contents of which are incorporated herein by reference.

INDUSTRIAL APPLICABILITY

The photosensitive resin structure for the flexographic printing plate according to the present invention has a wide range of industrial applicability in the general commercial printing field.

The invention claimed is:

1. A photosensitive resin structure for a flexographic printing plate, comprising (a): a support;

(b): a photosensitive resin composition layer which is located on the support (a) and which comprises a thermoplastic elastomer having a copolymer site of a monovinyl-substituted aromatic hydrocarbon and a conjugated diene; and (c): an infrared ray ablation layer which is laminated on the photosensitive resin composition layer (b) and which comprises a resin and carbon black, is ablatable with an infrared laser, and is a layer shielding a light beam other than infrared ray, wherein the resin in the infrared ray ablation layer (c) comprises a copolymer of a monovinyl-substituted aromatic hydrocarbon and a conjugated diene, or a hydrogenated copolymer of a monovinyl-substituted aromatic hydrocarbon and a conjugated diene, and a primary particle diameter of the carbon black contained in the infrared ray ablation layer (c) is 13 nm or larger and 17 nm or smaller and a DBP absorption number of the carbon black is 40 $cm^3$/100 g or more and 80 $cm^3$/100 g or less, thereby improving removability of the infrared ray ablation layer.

2. The photosensitive resin structure for the flexographic printing plate according to claim 1, wherein 90% by mass or more of the resin in the infrared ray ablation layer is a copolymer of a monovinyl-substituted aromatic hydrocarbon and a conjugated diene, or a hydrogenated copolymer of a monovinyl-substituted aromatic hydrocarbon and a conjugated diene.

3. The photosensitive resin structure for the flexographic printing plate according to claim 1, wherein the primary particle diameter of the carbon black is 15 nm or larger and 17 nm or smaller.

4. The photosensitive resin structure for the flexographic printing plate according to claim 1, wherein pH of the carbon black is 6.0 or higher and 8.5 or lower.

5. The photosensitive resin structure for the flexographic printing plate according to claim 1, wherein R which is calculated according to the following expression (1) from a Hansen solubility parameter value (HSP value) of the resin and a Hansen solubility parameter value (HSP value) of the carbon black in the infrared ray ablation layer is 11.0 or more and 13.0 or less:

$$R=(4\alpha^2+\beta^2+\gamma^2)^{0.5} \quad \text{Expression (1)}$$

α=an absolute value of difference between δd of the resin and δd of the carbon black β=an absolute value of difference between δp of the resin and δp of the carbon black γ=an absolute value of difference between δh of the resin and δh of the carbon black δd: energy from dispersion force between molecules δp: energy from dipolar interaction between molecules δh: energy from a hydrogen bond between molecules.

6. The photosensitive resin structure for the flexographic printing plate according to claim 1, wherein the resin in the infrared ray ablation layer (c) comprises a styrene-conjugated diene copolymer having a styrene content of 40% by mass or more and 80% by mass or less.

7. The photosensitive resin structure for the flexographic printing plate according to claim 1, wherein the resin in the infrared ray ablation layer (c) comprises a hydrogenated styrene-conjugated diene copolymer having a styrene content of 30% by mass or more and 70% by mass or less.

8. A method for producing a flexographic printing plate, using the photosensitive structure for the flexographic printing plate according to claim 1, and comprising:

first performing ultraviolet ray irradiation from a side of the support (a);

second drawing and processing a pattern on the infrared ray ablation layer (c) by infrared ray irradiation;

third irradiating the photosensitive resin composition layer (b) with an ultraviolet ray for pattern exposure; and fourth removing the infrared ray ablation layer (c) and an unexposed portion of the photosensitive resin composition layer (b).

9. The photosensitive resin structure for the flexographic printing plate according to claim 1, wherein the resin and carbon black are present in amounts of 50 to 90 wt % and 10 to 50 wt %, respectively, based on a combined weight of the resin and carbon black.

10. The photosensitive resin structure for the flexographic printing plate according to claim 1, wherein the resin in the infrared ray ablation layer (c) comprises the hydrogenated copolymer of a monovinyl-substituted aromatic hydrocarbon and the conjugated diene.

11. The photosensitive resin structure for the flexographic printing plate according to claim 1, wherein the resin in the infrared ray ablation layer (c) comprises the copolymer of the monovinyl-substituted aromatic hydrocarbon and the conjugated diene, and wherein a vinyl aromatic hydrocarbon compound in the copolymer of the monovinyl-substituted aromatic hydrocarbon and the conjugated diene comprises styrene, t-butylstyrene, divinylbenzene, 1,1-diphenylstyrene, N,N-dimethyl-p-aminoethylstyrene, N,N-diethyl-p-aminoethylstyrene, vinylpyridine, p-methoxystyrene, tertiary-butylstyrene, «-methylstyrene, and 1,1-diphenylethylene.

12. The photosensitive resin structure for the flexographic printing plate according to claim 1, wherein the resin in the infrared ray ablation layer (c) comprises the copolymer of the monovinyl-substituted aromatic hydrocarbon and the conjugated diene, and wherein the conjugated diene in the copolymer of the monovinyl-substituted aromatic hydrocarbon and the conjugated diene comprises 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene.

13. The photosensitive resin structure for the flexographic printing plate according to claim 1, wherein the resin in the infrared ray ablation layer (c) comprises the copolymer of the monovinyl-substituted aromatic hydrocarbon and the conjugated diene, and wherein a vinyl aromatic hydrocarbon compound in the copolymer of the monovinyl-substituted aromatic hydrocarbon and the conjugated diene comprises styrene and the conjugated diene in the copolymer of the monovinyl-substituted aromatic hydrocarbon and the conjugated diene comprises 1,3-butadiene.

14. The photosensitive resin structure for the flexographic printing plate according to claim 1, wherein the resin in the infrared ray ablation layer (c) comprises a styrene-butadiene-styrene copolymer or a hydrogenated styrene-butadiene-styrene copolymer.

* * * * *